United States Patent
Kim

(10) Patent No.: US 8,872,741 B2
(45) Date of Patent: Oct. 28, 2014

(54) ORGANIC LIGHT EMITTING DISPLAY AND METHOD OF DRIVING THE SAME

(75) Inventor: Min-Cheol Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 796 days.

(21) Appl. No.: 13/005,383

(22) Filed: Jan. 12, 2011

(65) Prior Publication Data

US 2012/0062524 A1 Mar. 15, 2012

(30) Foreign Application Priority Data

Sep. 14, 2010 (KR) .................. 10-2010-0089952

(51) Int. Cl.
G09G 3/32 (2006.01)
H01L 27/32 (2006.01)

(52) U.S. Cl.
CPC .......... *G06G 3/3233* (2013.01); *H01L 27/3276* (2013.01); *G09G 2310/0224* (2013.01)
USPC ............ 345/82; 345/77; 345/204; 315/169.1; 315/169.3

(58) Field of Classification Search
USPC ................. 345/76–83, 204; 315/169.1–169.3
See application file for complete search history.

(56) References Cited

U.S. PATENT DOCUMENTS

| 2002/0047822 A1* | 4/2002 | Senda et al. ................. 345/90 |
| 2010/0097510 A1* | 4/2010 | Wada et al. ................. 348/308 |
| 2010/0231617 A1* | 9/2010 | Ueda et al. ................. 345/690 |
| 2011/0157502 A1* | 6/2011 | Qiao et al. ................. 349/37 |
| 2011/0157503 A1* | 6/2011 | Chung et al. ................. 349/37 |

FOREIGN PATENT DOCUMENTS

| KR | 1020050023082 A | 3/2005 |
| KR | 1020090041870 A | 4/2009 |
| KR | 1020090072400 A | 7/2009 |
| KR | 1020090090657 A | 8/2009 |

* cited by examiner

*Primary Examiner* — Jennifer Nguyen
(74) *Attorney, Agent, or Firm* — Christie, Parker & Hale, LLP

(57) ABSTRACT

An organic light emitting display includes a first pixel region including pixels coupled to odd scan lines and odd data lines, a second pixel region including pixels coupled to even scan lines and the odd data lines, a third pixel region including pixels coupled to the odd scan lines and even data lines, a fourth pixel region including pixels coupled to the even scan lines and the even data lines, a data analyzing unit for dividing input screen data of one frame into the pixel regions, a scan driver for sequentially supplying scan signals to the odd scan lines twice and for sequentially supplying scan signals to the even scan lines twice in one frame, and a data driver for supplying data signals corresponding to the screen data divided by the data analyzing unit to the pixel regions through the data lines.

7 Claims, 3 Drawing Sheets

ORGANIC LIGHT EMITTING DISPLAY AND METHOD OF DRIVING THE SAME

CROSS-REFERENCE TO RELATED APPLICATION

This application claims priority to and the benefit of Korean Patent Application No. 10-2010-0089952, filed on Sep. 14, 2010, in the Korean Intellectual Property Office, the entire content of which is incorporated herein by reference.

BACKGROUND

1. Field

The following description relates to an organic light emitting display and a method of driving the same, and more particularly, to an organic light emitting display capable of removing motion blur without increase in power consumption and a method of driving the same.

2. Description of Related Art

Recently, various flat panel displays (FPD) that are lighter in weight and smaller in volume as compared with cathode ray tubes (CRT) have been developed. The FPDs include liquid crystal displays (LCD), field emission displays (FED), plasma display panels (PDP), and organic light emitting displays.

Among the FPDs, the organic light emitting displays display images using organic light emitting diodes (OLED) that generate light by re-combination of electrons and holes. The organic light emitting display has high response speed and is driven with low power consumption.

In general, the OLED is divided into a passive matrix type OLED (PMOLED) and an active matrix type OLED (AMOLED) according to a method of driving the OLED.

The AMOLED includes a plurality of gate lines, a plurality of data lines, a plurality of power source lines, and a plurality of pixels coupled to the above lines and arranged in the form of a matrix. In addition, each of the pixels commonly includes an OLED, two transistors, that is, a switching transistor for transmitting a data signal and a driving transistor for driving the organic light emitting diode (OLED) in accordance with the data signal, and a capacitor for maintaining the data voltage.

In order to remove motion blur generated in the organic light emitting display, in a conventional art, a method of increasing a frame rate to repeatedly display the same frame on a screen for a time when an input is performed or of inserting black data is used.

However, the method of repeatedly displaying the same frame has little effect on improving motion blur and increases power consumption and the method of inserting the black data causes flickering.

SUMMARY

Accordingly, an aspect of an embodiment of the present invention is directed toward an organic light emitting display capable of dividing the screen of one frame into four pixel regions to display the divided pixel regions and of removing motion blur without increasing power consumption and a method of driving the same.

In order to achieve the foregoing and/or other aspects of the present invention, an organic light emitting display according to an embodiment of the present invention is provided to include: a first pixel region including pixels coupled to odd scan lines and odd data lines; a second pixel region including pixels coupled to even scan lines and the odd data lines; a third pixel region including pixels coupled to the odd scan lines and even data lines; a fourth pixel region including pixels coupled to the even scan lines and the even data lines; a data analyzing unit for dividing input screen data of one frame into the pixel regions; a scan driver for sequentially supplying scan signals to the odd scan lines twice and for sequentially supplying scan signals to the even scan lines twice in the one frame; and a data driver for supplying data signals corresponding to the screen data divided by the data analyzing unit to the pixel regions through the data lines.

In one embodiment, the data driver is configured to supply a data signal of the data signals corresponding to the screen data of the first pixel region to the odd data lines in one period of two periods where the scan signals are sequentially supplied to the odd scan lines and to supply a data signal of the data signals corresponding to the screen data of the third pixel region in a remaining one period of the two periods to the even data lines, and the data driver is configured to supply a data signal of the data signals corresponding to the screen data of the second pixel region to the odd data lines in one period of two periods where the scan signals are sequentially supplied to the even scan lines and to supply a data signal of the data signals corresponding to the screen data of the fourth pixel region in a remaining one period of the two periods to the even data lines.

In one embodiment, the scan driver is configured to sequentially supply the scan signals to the odd scan lines in a first period of the one frame, to sequentially supply the scan signals to the even scan lines in a second period of the one frame, to sequentially supply the scan signals to the odd scan lines in a third period of the one frame, and to sequentially supply the scan signals to the even scan lines in a fourth period of the one frame. Also, in one embodiment, the data driver is configured to supply a data signal of the data signals corresponding to the screen data of the first pixel region to the odd data lines in the first period, to supply a data signal of the data signals corresponding to the screen data of the second pixel region to the odd data lines in the second period, to supply a data signal of the data signals corresponding to the screen data of the third pixel region to the even data lines in the third period, and to supply a data signal of the data signals corresponding to the screen data of the fourth pixel region to the even data lines in the fourth period.

Another embodiment of the present invention provides a method of driving an organic light emitting display including a first pixel region including pixels coupled to odd scan lines and odd data lines, a second pixel region including pixels coupled to even scan lines and the odd data lines, a third pixel region including pixels coupled to the odd scan lines and even data lines, and a fourth pixel region including pixels coupled to the even scan lines and the even data lines. The method includes dividing input screen data of one frame into the pixel regions.

In one embodiment, the method further includes sequentially supplying scan signals and data signals corresponding to the screen data of the corresponding pixel regions to the pixel regions in a specific order to display a screen of the one frame four times. Here, the sequentially supplying the scan signals and the data signals corresponding to the screen data of the corresponding pixel regions to the pixel regions in the specific order to display the screen of the one frame four times may include: sequentially supplying the scan signals to the odd scan lines and supplying a data signal of the data signals corresponding to the screen data of the first pixel region to the odd data lines in a first period of the one frame; sequentially supplying the scan signals to the even scan lines and supplying a data signal of the data signals corresponding to the screen data of the second pixel region to the odd data lines in a second period of the one frame; sequentially supplying the scan signals to the odd scan lines and supplying a data signal of the data signals corresponding to the screen data of the third pixel region to the even data lines in a third period of the one frame; and sequentially supplying the scan signals to the even scan lines and supplying a data signal of the data signals corresponding to the screen data of the fourth pixel region to the even data lines in a fourth period of the one frame.

As described above, embodiments of the present invention provide an organic light emitting display capable of dividing the screen of one frame into four pixel regions to display the divided pixel regions and of removing motion blur without increasing power consumption and/or a method of driving the same may be provided.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION OF THE EMBODIMENTS

Figure 1:
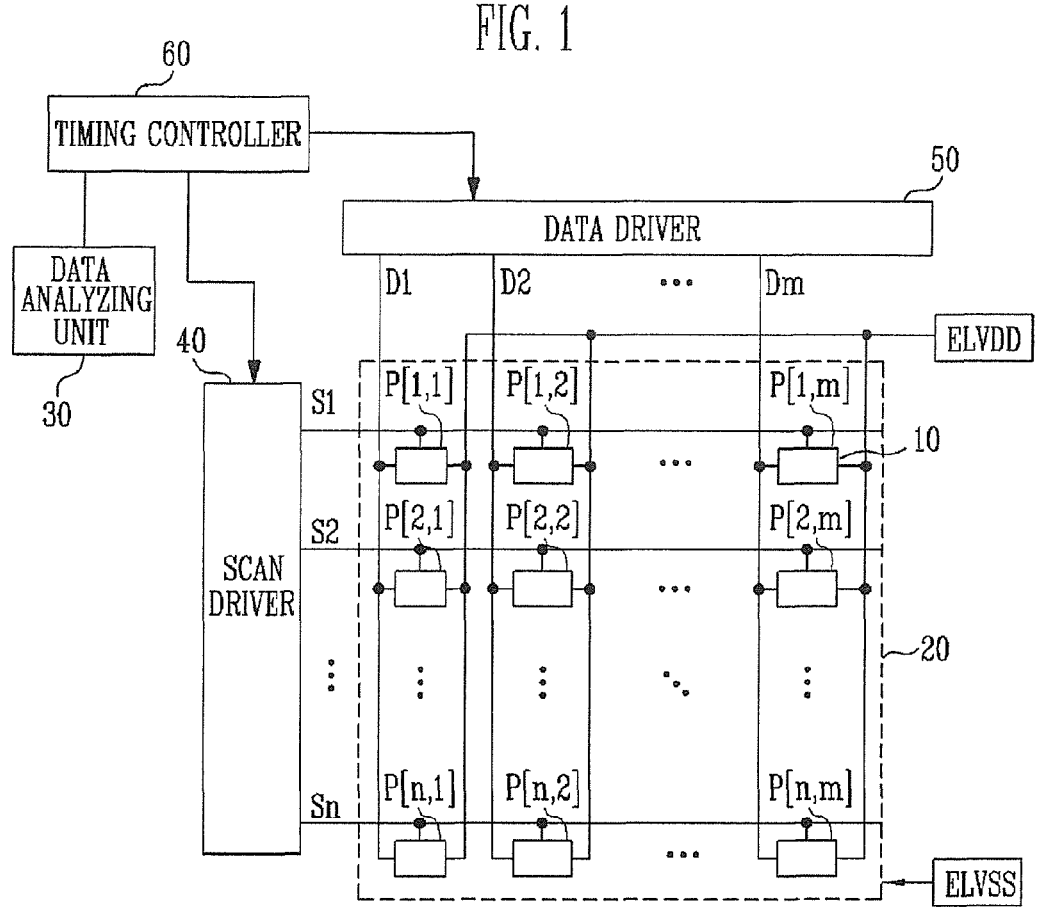
FIG. 1 is a view illustrating an organic light emitting display according to an exemplary embodiment of the present invention.

Hereinafter, certain exemplary embodiments according to the present invention will be described with reference to the accompanying drawings. Here, when a first element is described as being coupled to a second element, the first element may be not only directly coupled to the second element but may also be indirectly coupled to the second element via one or more third elements. Further, some of the elements that are not essential to the complete understanding of the invention are omitted for clarity. Also, like reference numerals refer to like elements throughout.

Detailed items of the other embodiments are included in detailed description and drawings.

The advantages and characteristics of the present invention and a method of achieving the advantages and characteristics of the present invention now will be described more fully with reference to the accompanying drawings, in which exemplary embodiments of the invention are shown. This invention may, however, be embodied in many different forms and should not be construed as being limited to the embodiments set forth herein. In the drawings, when a part is coupled to another part, the part may be directly coupled to the other part or the part may be electrically coupled to the other part with yet another part interposed therebetween. In the drawings, the part that is not related to the present invention is omitted for clarity of description. The same reference numerals in different drawings represent the same element, and thus their description will be omitted.

Hereinafter, the present invention will be described with reference to the accompanying drawings.

Figure 2:
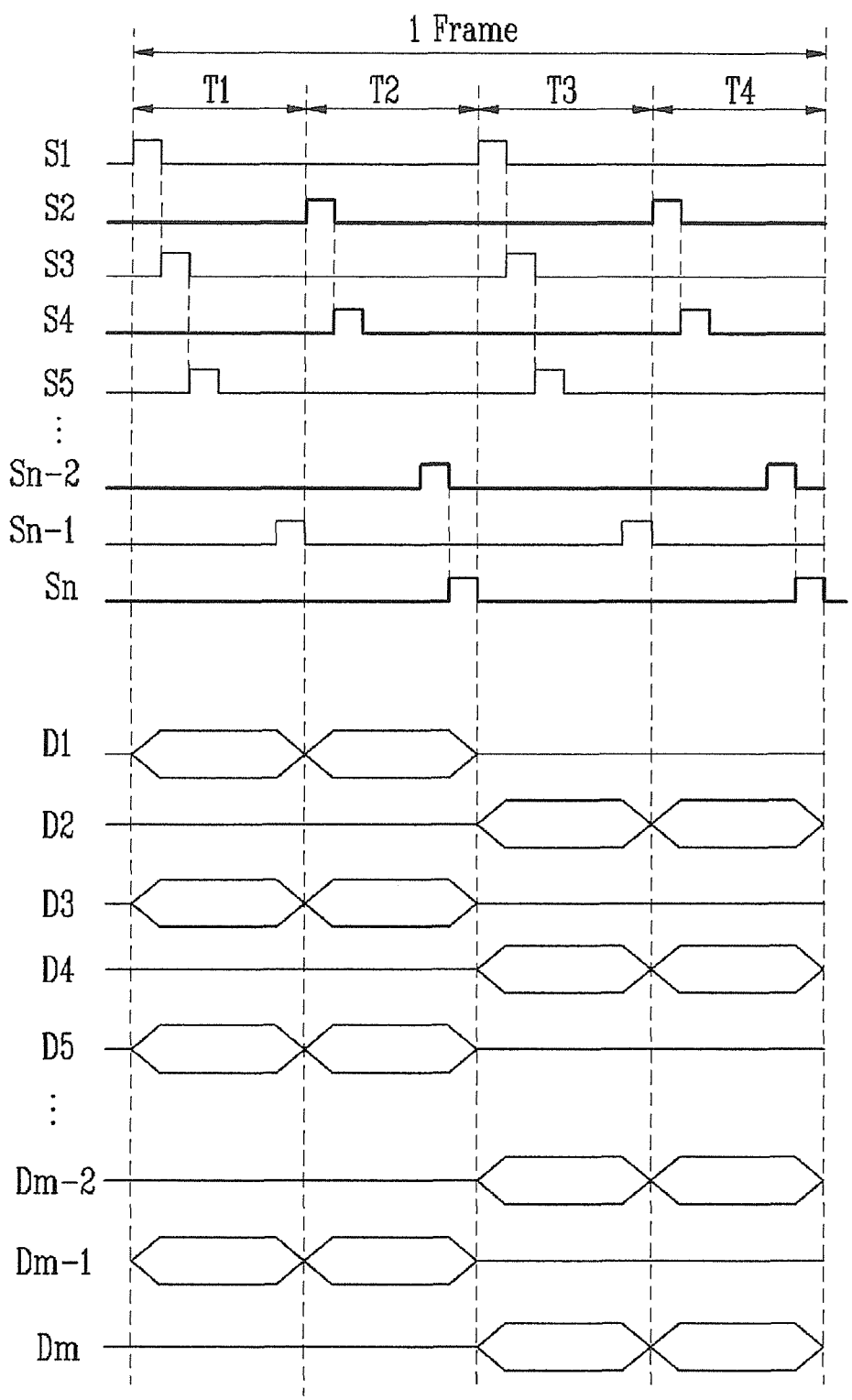
FIG. 2 is a waveform chart illustrating a method of driving the organic light emitting display according to the exemplary embodiment of the present invention.

FIG. 1 is a view illustrating an organic light emitting display according to an exemplary embodiment of the present invention. FIG. 2 is a waveform chart illustrating a method of driving the organic light emitting display according to the exemplary embodiment of the present invention.

Referring to FIG. 1, the organic light emitting display according to exemplary embodiment of the present invention includes a pixel unit (display region) 20 including pixels 10 coupled to scan lines S1 to Sn and data lines D1 to Dm, a data analyzing unit 30 for dividing input screen data of one frame into pixel regions, a scan driver 40 for supplying scan signals to the pixels 10 through scan lines S1 to Sn, and a data driver 50 for supplying data signals to the pixels 10 through data lines D1 to Dm, and a timing controller 60 for controlling the data analyzing unit 30, the scan driver 40, and the data driver 50.

The pixel unit 20 includes a first pixel region, a second pixel region, a third pixel region, and a fourth pixel region.

The first pixel region includes pixels coupled to odd scan lines S1, S3, . . . and odd data lines D1, D3, . . . . When each of the pixels is defined as P[the number of a coupled scan line, the number of a coupled data line], pixels of P[1, 1], P[1, 3], and P[3, 1] are included in the first pixel region.

The second pixel region includes pixels coupled to even scan lines S2, S4, . . . and odd data lines D1, D3, . . . . The second pixel region includes pixels of P[2, 1], P[2, 3], and P[2, 5].

The third pixel region includes pixels coupled to odd scan lines S1, S3, . . . and even data lines D2, D4, . . . . The second pixel region includes pixels of P[1, 2], P[1, 4], and P[1, 6].

The fourth pixel region includes pixels coupled to even scan lines S2, S4, . . . and odd data lines D1, D3, . . . . The fourth pixel region includes pixels of P[2, 2], P[2, 4], and P[4, 2].

Figure 3:
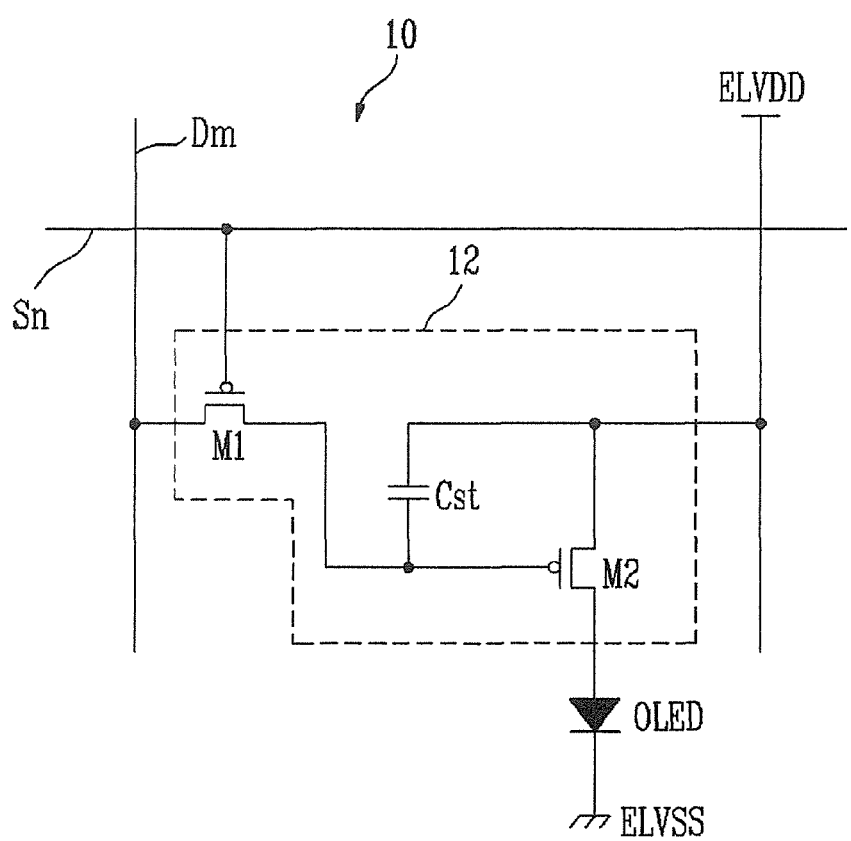
FIG. 3 is a view illustrating a pixel according to the exemplary embodiment of the present invention.

FIG. 3 is a view illustrating a pixel according to the exemplary embodiment of the present invention. In FIG. 3, for convenience sake, the pixel coupled to the nth scan line Sn and the mth data line Dm will be illustrated.

The pixels 10 are coupled to the first power source ELVDD and the second power source ELVSS in order to generate light components corresponding to data signals. Here, the first power source ELVDD may be a high potential power source, and the second power source ELVSS may be a low potential power source (for example, a ground power source) having a voltage in a lower level than the first power source ELVDD.

Referring to FIG. 3, each of the pixels 10 of the organic light emitting display includes an OLED and a pixel circuit 12 coupled to the data line Dm and the scan line Sn to control the OLED.

The anode electrode of the OLED is coupled to the pixel circuit 12, and the cathode electrode of the OLED is coupled to the second power source ELVSS.

The OLED generates light with set or predetermined brightness to correspond to the current supplied from the pixel circuit 12.

The pixel circuit 12 controls the amount of current supplied to the OLED to correspond to the data signal supplied to the data line Dm when the scan signal is supplied to the scan line Sn. Therefore, the pixel circuit 12 includes: a second transistor M2 coupled between the first power source ELVDD and the OLED; a first transistor M1 coupled with the second transistor M2, the data line Dm, and the scan line Sn; and a storage capacitor Cst coupled between the gate electrode of the second transistor M2 and the first electrode of the second transistor M2.

The gate electrode of the first transistor M1 is coupled to the scan line Sn, and the first electrode of the first transistor M1 is coupled to the data line Dm. The second electrode of the first transistor M1 is coupled to one terminal of the storage capacitor Cst. Here, the first electrode is either a source electrode or a drain electrode; and the second electrode is set as an electrode different from the first electrode. For example, when the first electrode is set as the source electrode, the second electrode is set as the drain electrode. The first transistor M1 coupled to the scan line Sn and the data line Dm is turned on when the scan signal is supplied from the scan line Sn to supply the data signal supplied from the data line Dm to the storage capacitor Cst. At this time, the storage capacitor Cst charges the voltage corresponding to the data signal.

The gate electrode of the second transistor M2 is coupled to one terminal of the storage capacitor Cst, and the first electrode of the second transistor M2 is coupled to the other terminal of the storage capacitor Cst and the first power source ELVDD. The second electrode of the second transistor M2 is coupled to the anode electrode of the OLED. The second transistor M2 controls the amount of current that flows from the first power source ELVDD to the second power source ELVSS via the OLED to correspond to the voltage value stored in the storage capacitor Cst. Here, the OLED generates light corresponding to the amount of current supplied from the second transistor M2.

The above-described pixel structure of FIG. 3 is only an embodiment of the present invention and the pixel 10 according to the present invention is not limited to the pixel structure.

The scan driver 40 generates scan signals by the control of the timing controller 60 and supplies the generated scan signals to the scan lines S1 to Sn.

The scan driver 40 distinguishes odd scan lines S, S3, . . . from even scan lines S2, S4, . . . to sequentially supply the scan signals. In particular, in one frame, the sequential supply of the scan signals to the odd scan lines S1, S3, . . . is performed twice, and the sequential supply of the scan signals to the even scan lines S2, S4, . . . is performed twice.

For example, as illustrated in FIG. 2, when one frame is divided into first to fourth periods T1 to T4, scans signals are sequentially supplied to the odd scan lines S1, S3, . . . in the first period T1, scan signals are sequentially supplied to the even scan lines S2, S4, . . . in the second period T2, scan signals are sequentially supplied to the odd scan line 51, S3, . . . in the third period T3, and scan signals are sequentially supplied to the even scan lines S2, S4, . . . .

However, the scan signals are not necessarily supplied in the above-described order and may be supplied in another order when the scan signals are sequentially supplied to the odd scan lines S1, S3, . . . twice in one frame and when the scan signals are sequentially supplied to the even scan lines S2, S4, . . . twice. The period where the scan signals are sequentially supplied to the odd scan lines S1, S3, . . . twice may not overlap the period where the scan signals are sequentially supplied to the even scan lines S2, S4, . . . twice.

The data analyzing unit 30 divides the input screen data of one frame into first to fourth pixel regions. Such an operation may be performed when the screen data of a previous frame are sequentially displayed on the pixel regions.

At this time, the data divided from the screen data of one frame are referred to the screen data of the first pixel region, the screen data of the second pixel region, the screen data of the third pixel region, and the screen data of the fourth pixel region.

The data analyzing unit 30 includes a frame memory capable of storing the divided screen data of the first to fourth pixel regions. The data analyzing unit 30 may be built in the timing controller 60.

The timing controller 60 aligns the screen data divided into the pixel regions by the data analyzing unit 30 to be suitable for driving to supply the screen data to the data driver 50.

The data driver 50 converts the screen data of the pixel regions received by the control of the timing controller 60 into data signals having set or predetermined level voltages in accordance with the gray scale values of the screen data and supplies the generated data signals into the data lines D1 to Dm.

Here, the data signals converted from the screen data of the pixel regions are referred to the data signal of the first pixel region, the data signal of the second pixel region, the data signal of the third pixel region, and the data signal of the fourth pixel region.

In order to divide the screen of one frame into the first to fourth pixel regions and to display the screen four times in a specific order, the data analyzing unit 30 supplies the data signals of the first to fourth pixel regions to the pixel regions in units of lines in the specific order.

In detail, the data driver 50 supplies the data signal (the data signal of the first pixel region) corresponding to the screen data of the first pixel region to the odd data lines D1, D3, . . . in one period of the two periods where the scan signals are sequentially supplied to the odd scan lines S1, S3, . . . so that the pixels included in the first pixel region sequentially emit light.

In the remaining one period of the two periods where the scan signals are sequentially supplied to the odd scan lines S1, S3, . . . ; the data signal (the data signal of the third pixel region) corresponding to the screen data of the third pixel region is supplied to the even data lines D2, D4, . . . so that the pixels included in the third pixel region sequentially emit light.

In addition, the data driver 50 supplies the data signal (the data signal of the second pixel region) corresponding to the screen data of the second pixel region to the odd data lines D1, D3, . . . in one period of the two periods where the scan signals are sequentially supplied to the even scan lines S2, S4, . . . so that the pixels included in the second pixel region sequentially emit light.

In the remaining one period of the two periods where the scan signals are sequentially supplied to the even scan lines S2, S4, . . . , the data signal (the data signal of the fourth pixel region) corresponding to the screen data of the fourth pixel region is supplied to the even data lines D2, D4, . . . so that the pixels included in the fourth pixel region sequentially emit light.

Referring to FIG. 2, a method of driving the organic light emitting display will be described.

First, the data analyzing unit 30 divides the input screen data of one frame to generate data of the first to fourth pixel regions.

The timing controller 60 supplies the data of the first to fourth pixel regions to the data driver 50 in a specific order.

The data driver 50 generates the data signals corresponding to the supplied data of the pixel regions.

Then, in the first period t1 of one frame, the scan signals are sequentially supplied to the odd scan lines S1, S3, . . . ; and the data signal (the data signal of the first pixel region) corresponding to the screen data of the first pixel region is supplied to the odd data lines D1, D3, . . . . The pixels included in the first pixel region emit light with brightness corresponding to the data signal of the first pixel region.

Then, in the second period T2 of one frame, the scan signals are sequentially supplied to the even scan lines S2, S4, . . . and the data signal (the data signal of the second pixel region) corresponding to the screen data of the second pixel region is supplied to the odd data lines D1, D3, . . . . The pixels included in the second pixel region emit light with brightness corresponding to the data signal of the second pixel region.

Then, in the third period t3 of one frame, the scan signals are sequentially supplied to the odd scan lines S1, S3, . . . ; and the data signal (the data signal of the third pixel region) corresponding to the screen data of the third pixel region is supplied to the even data lines D2, D4, . . . . The pixels included in the third pixel region emit light with the brightness corresponding to the data signal of the third pixel region.

Then, in the fourth period T4 of one frame, the scan signals are sequentially supplied to the even scan lines S2, S4, . . . ; and the data signal (the data signal of the fourth pixel region) corresponding to the screen data of the fourth pixel region is supplied to the even data lines D2, D4, . . . . The pixels included in the fourth pixel region emit light with the brightness corresponding to the data signal of the fourth pixel region.

Therefore, the screen data of one frame are divided into four pixel regions to be sequentially displayed so that motion blur may be removed without increase in power consumption.

The pixel regions emitting light may be performed in a different order from the embodiment. That is, light is not emitted in the order of the first pixel region, the second pixel region, the third pixel region, and the fourth pixel region as in the embodiment, but is emitted in the order of another suitable combination.

In view of the foregoing, an embodiment of the present invention provides an organic light emitting display in which the screen of one frame is divided into four pixel regions to be displayed so that motion blur is removed without increase in power consumption.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic light emitting display, comprising:
    a first pixel region comprising pixels coupled to odd scan lines and odd data lines;
    a second pixel region comprising pixels coupled to even scan lines and the odd data lines;
    a third pixel region comprising pixels coupled to the odd scan lines and even data lines;
    a fourth pixel region comprising pixels coupled to the even scan lines and the even data lines;
    a data analyzing unit for dividing input screen data of one frame into the pixel regions;
    a scan driver for sequentially supplying scan signals to the odd scan lines twice and for sequentially supplying scan signals to the even scan lines twice in the one frame, the scan signals to the odd scan lines being all offset in time from one another and the scan signals to the even scan lines being all offset in time from one another; and
    a data driver for supplying data signals corresponding to the screen data divided by the data analyzing unit to the pixel regions through the data lines.

2. The organic light emitting display as claimed in claim 1, wherein the data driver is configured to supply a data signal of the data signals corresponding to the screen data of the first pixel region to the odd data lines in one period of two periods where the scan signals are sequentially supplied to the odd scan lines and to supply a data signal of the data signals corresponding to the screen data of the third pixel region in a remaining one period of the two periods to the even data lines,
    wherein the data driver is configured to supply a data signal of the data signals corresponding to the screen data of the second pixel region to the odd data lines in one period of two periods where the scan signals are sequentially supplied to the even scan lines and to supply a data signal of the data signals corresponding to the screen data of the fourth pixel region in a remaining one period of the two periods to the even data lines.

3. The organic light emitting display as claimed in claim 1, wherein the scan driver is configured to sequentially supply the scan signals to the odd scan lines in a first period of the one frame, to sequentially supply the scan signals to the even scan lines in a second period of the one frame, to sequentially supply the scan signals to the odd scan lines in a third period of the one frame, and to sequentially supply the scan signals to the even scan lines in a fourth period of the one frame.

4. The organic light emitting display as claimed in claim 3, wherein the data driver is configured to supply a data signal of the data signals corresponding to the screen data of the first pixel region to the odd data lines in the first period, to supply a data signal of the data signals corresponding to the screen data of the second pixel region to the odd data lines in the second period, to supply a data signal of the data signals corresponding to the screen data of the third pixel region to the even data lines in the third period, and to supply a data signal of the data signals corresponding to the screen data of the fourth pixel region to the even data lines in the fourth period.

5. A method of driving an organic light emitting display including a first pixel region including pixels coupled to odd scan lines and odd data lines, a second pixel region including pixels coupled to even scan lines and the odd data lines, a third pixel region including pixels coupled to the odd scan lines and even data lines, a fourth pixel region including pixels coupled to the even scan lines and the even data lines, the method comprising:
    dividing input screen data of one frame into the pixel regions; and
    sequentially supplying scan signals to the odd scan lines twice and sequentially supplying scan signals to the even scan lines twice in the one frame, the scan signals to the odd scan lines being all offset in time from one another and the scan signals to the even scan lines being all offset in time from one another.

6. The method as claimed in claim 5, further comprising:
    sequentially supplying scan signals and data signals corresponding to the screen data of the corresponding pixel regions to the pixel regions in a specific order to display a screen of the one frame four times.

7. A method of driving an organic light emitting display including a first pixel region including pixels coupled to odd scan lines and odd data lines, a second pixel region including pixels coupled to even scan lines and the odd data lines, a third pixel region including pixels coupled to the odd scan lines and even data lines, a fourth pixel region including pixels coupled to the even scan lines and the even data lines, the method comprising:
    dividing input screen data of one frame into the pixel regions;
    sequentially supplying the scan signals to the odd scan lines and supplying a data signal of the data signals corresponding to the screen data of the first pixel region to the odd data lines in a first period of the one frame;
    sequentially supplying the scan signals to the even scan lines and supplying a data signal of the data signals corresponding to the screen data of the second pixel region to the odd data lines in a second period of the one frame;

sequentially supplying the scan signals to the odd scan lines and supplying a data signal of the data signals corresponding to the screen data of the third pixel region to the even data lines in a third period of the one frame; and sequentially supplying the scan signals to the even scan lines and supplying a data signal of the data signals corresponding to the screen data of the fourth pixel region to the even data lines in a fourth period of the one frame.

* * * * *